(12) United States Patent
Chen et al.

(10) Patent No.: US 12,087,814 B2
(45) Date of Patent: Sep. 10, 2024

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Chia-Chung Chen, Keelung (TW); Wen-Shen Chou, Zhubei (TW); Yung-Chow Peng, Hsinchu (TW); Ya Yun Liu, Jhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 374 days.

(21) Appl. No.: 17/587,798

(22) Filed: Jan. 28, 2022

(65) Prior Publication Data
US 2023/0037526 A1   Feb. 9, 2023

Related U.S. Application Data

(60) Provisional application No. 63/230,617, filed on Aug. 6, 2021.

(51) Int. Cl.
*H01L 29/06* (2006.01)
*G01K 7/01* (2006.01)
(Continued)

(52) U.S. Cl.
CPC ...... *H01L 29/0665* (2013.01); *H01L 21/0259* (2013.01); *H01L 29/42392* (2013.01);
(Continued)

(58) Field of Classification Search
CPC ............. H01L 29/0665; H01L 21/0259; H01L 29/42392; H01L 29/66545; H01L 29/66553; H01L 29/66742; H01L 29/735; H01L 29/78618; H01L 29/78696; H01L 29/861; H01L 29/0804; H01L 29/732;
(Continued)

(56) References Cited

U.S. PATENT DOCUMENTS

2018/0158950 A1*   6/2018   Chen ................... H01L 29/1083

FOREIGN PATENT DOCUMENTS

TW             202117820         5/2021

* cited by examiner

*Primary Examiner* — Mohammad A Rahman
(74) *Attorney, Agent, or Firm* — FOLEY & LARDNER LLP

(57) ABSTRACT

A semiconductor device includes a first semiconductor well. The semiconductor device includes a channel structure disposed above the first semiconductor well and extending along a first lateral direction. The semiconductor device includes a gate structure extending along a second lateral direction and straddling the channel structure. The semiconductor device includes a first epitaxial structure disposed on a first side of the channel structure. The semiconductor device includes a second epitaxial structure disposed on a second side of the channel structure, the first side and second side opposite to each other in the first lateral direction. The first epitaxial structure is electrically coupled to the first semiconductor well with a second semiconductor well in the first semiconductor well, and the second epitaxial structure is electrically isolated from the first semiconductor well with a dielectric layer.

18 Claims, 17 Drawing Sheets

(51) Int. Cl.
*H01L 21/02* (2006.01)
*H01L 29/423* (2006.01)
*H01L 29/66* (2006.01)
*H01L 29/735* (2006.01)
*H01L 29/786* (2006.01)
*H01L 29/861* (2006.01)

(52) U.S. Cl.
CPC .. *H01L 29/66545* (2013.01); *H01L 29/66553* (2013.01); *H01L 29/66742* (2013.01); *H01L 29/735* (2013.01); *H01L 29/78618* (2013.01); *H01L 29/78696* (2013.01); *H01L 29/861* (2013.01); *G01K 7/015* (2013.01)

(58) Field of Classification Search
CPC ............. H01L 29/0673; H01L 29/0847; H01L 29/66439; H01L 29/775; H01L 29/165; H01L 29/267; G01K 7/015; G01K 7/01; B82Y 10/00
See application file for complete search history.

SEMICONDUCTOR DEVICES AND METHODS OF MANUFACTURING THEREOF

CROSS-REFERENCE TO RELATED APPLICATION

This application claims priority to and the benefit of U.S. Provisional Application No. 63/230,617, filed Aug. 6, 2021, entitled "ASYMMETRICAL NANOSHEET DEVICES," which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
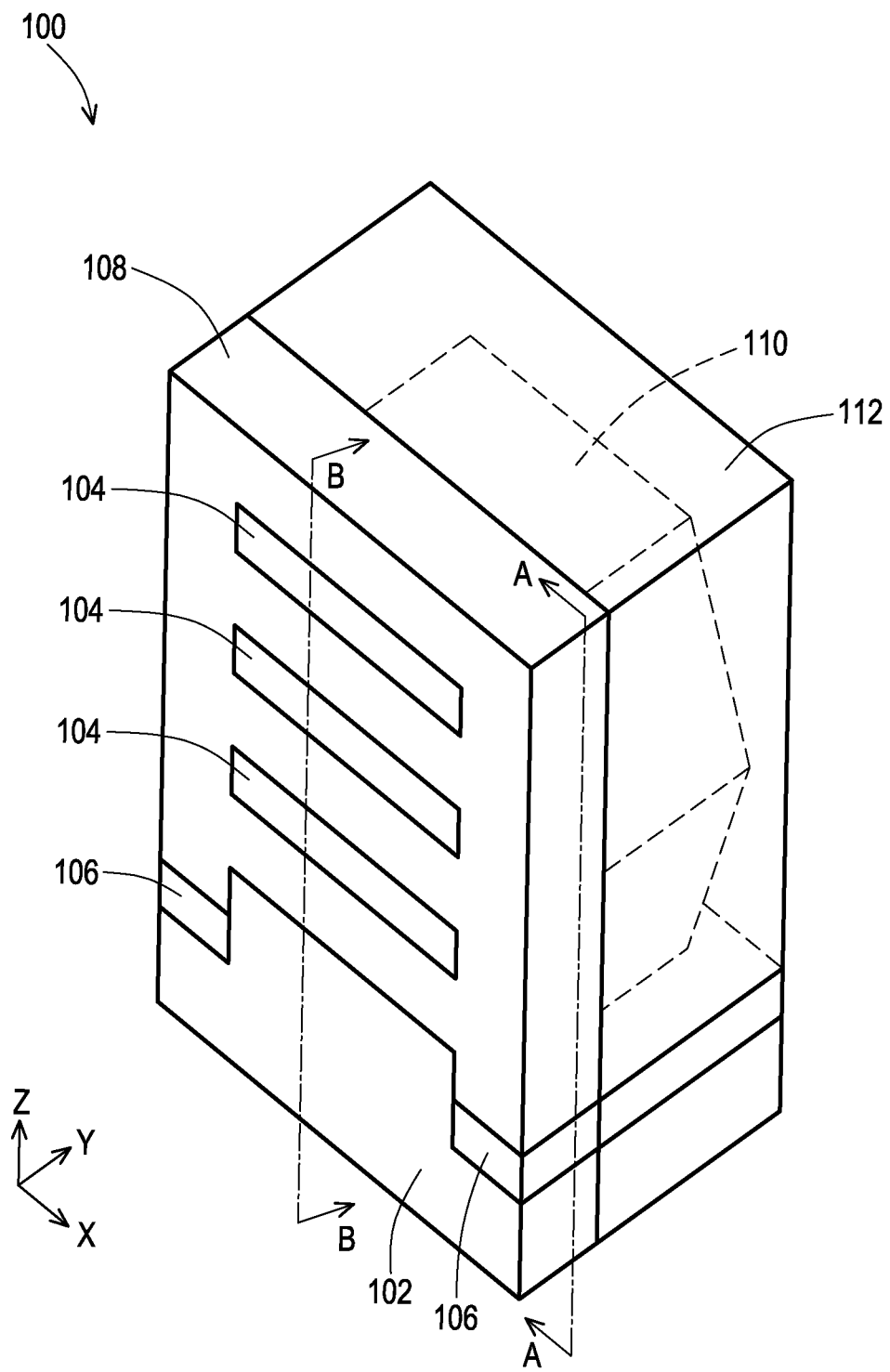
FIG. 1 illustrates a perspective view of a gate-all-around (GAA) field-effect-transistor (FET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Continued innovations in semiconductor process technologies are enabling higher integration densities and device scaling. As the semiconductor industry moves towards smaller technology nodes, planar and non-planar semiconductor field-effect-transistor (FET) device structures should be scaled to smaller dimensions to provide increased device width per footprint area. In this regard, nanostructure (e.g., nanosheet, nanowire, or otherwise gate-all-around (GAA)) FET devices are considered to be a viable option for continued complementary-metal-oxide-semiconductor (CMOS) scaling. In general, a nanostructure FET device includes a device channel which includes one or more nanosheet layers in a stacked configuration. Each nanosheet layer typically has a vertical thickness that is substantially less than its width. A gate structure is formed above and below each nanosheet layer in a stacked configuration, thereby increasing the FET device width (or channel width), and thus the drive current, for a given footprint area.

One challenge in fabricating nanostructure FET devices is the ability to effectively isolate the nanostructure FET devices from an underlying semiconductor substrate. For example, depending on the FET structure, a parasitic transistor channel can be formed in the semiconductor substrate, thereby resulting in unwanted current leakage and parasitic capacitance. To suppress leakage current due to the parasitic transistor channel, the semiconductor substrate below the parasitic transistor channel can be heavily doped. However, this approach can lead to increased junction leakage between source/drain structures and the heavily doped semiconductor substrate, as well as parasitic capacitance between the gate and the heavily doped semiconductor substrate. In this regard, some have proposed to form an insulating layer between the source/drain structures and the semiconductor substrate, without heavily doping the semiconductor substrate. When the nanostructure FET devices are used in certain analog applications (e.g., electrostatic circuits, eFuse, radio frequency circuits, general-purpose input/output circuits, thermal sensors, bandgap reference circuits, etc.), it is generally desired to have a p-n junction coupled to at least one of the source or drain structure, for example, in order to release plasma charges. With such an insulating layer disposed between each of both the source and drain structures and the substrate, applications of the nanostructure FET devices may be significantly limited. Thus, the existing nanostructure FET devices have not been entirely satisfactory in many aspects.

Embodiments of the present disclosure are discussed in the context of forming a nanostructure field-effect-transistor (FET) device, and in particular, in the context of forming a gate-all-around (GAA) FET device. For example, the GAA FET device, as disclosed herein, includes its drain structure and source structure formed on opposite sides of a channel structure (formed of one or more nanostructures) in an asymmetrical manner. For example, the GAA FET device includes a first epitaxial structure, configured as the drain structure (or terminal), that is electrically isolated from a semiconductor substrate or a semiconductor well with a dielectric layer; and a second epitaxial structure, configured as the source structure (or terminal), that is electrically coupled to the semiconductor substrate through a semiconductor well. In some embodiments, the semiconductor well underlying the second epitaxial structure and the semiconductor substrate can form a p-n junction electrically coupled to the source structure, while the drain structure is electrically isolated from the semiconductor substrate. Forming a GAA FET device in such a configuration can provide various advantages. For example, as most of the leakage current is generally induced on the drain structure, having the drain structure electrically isolated from the substrate can greatly reduce the leakage current. Further, a depth of the semiconductor well underlying the second epitaxial structure (the source structure) can be adjusted. By increasing the depth of the semiconductor well, an intrinsic gain of the GAA FET device (e.g., gas) can be increased accordingly, which makes the disclosed GAA FET device a promising candidate for various analog-related applications.

FIG. 1 illustrates a perspective view of an example GAA FET device 100, in accordance with various embodiments. The GAA FET device 100 includes a semiconductor substrate (or semiconductor well) 102 and a number of nanostructures (e.g., nanosheets, nanowires, etc.) 104 above the substrate 102. The semiconductor layers 104 are vertically separated from one another. Isolation regions 106 are formed on opposing sides of a protruded portion of the substrate 102, with the nanostructures 104 disposed above the protruded portion. A gate structure 108 wraps around each of the nanostructures 104 (e.g., a full perimeter of each of the nanostructures 104). Source and drain structures are disposed on opposing sides of the gate structure 108, e.g., source/drain structure 110 shown in FIG. 1. An interlayer dielectric (ILD) 112 is disposed over the source/drain structure 110.

The GAA FET device shown in FIG. 1 is simplified, and thus, it should be understood that one or more features of a completed GAA FET device may not be shown in FIG. 1. For example, the other source/drain structure opposite the gate structure 108 from the source/drain structure 110 and the ILD disposed over such a source/drain structure are not shown in FIG. 1. Further, FIG. 1 is provided as a reference to illustrate a number of cross-sections in subsequent figures. As indicated, cross-section A-A is cut along a longitudinal axis of the gate structure 108 (e.g., in the X direction); and cross-section B-B is cut along a longitudinal axis of one of the semiconductor layers 104 (e.g., in the Y direction). Subsequent figures refer to these reference cross-sections for clarity.

Figure 2:
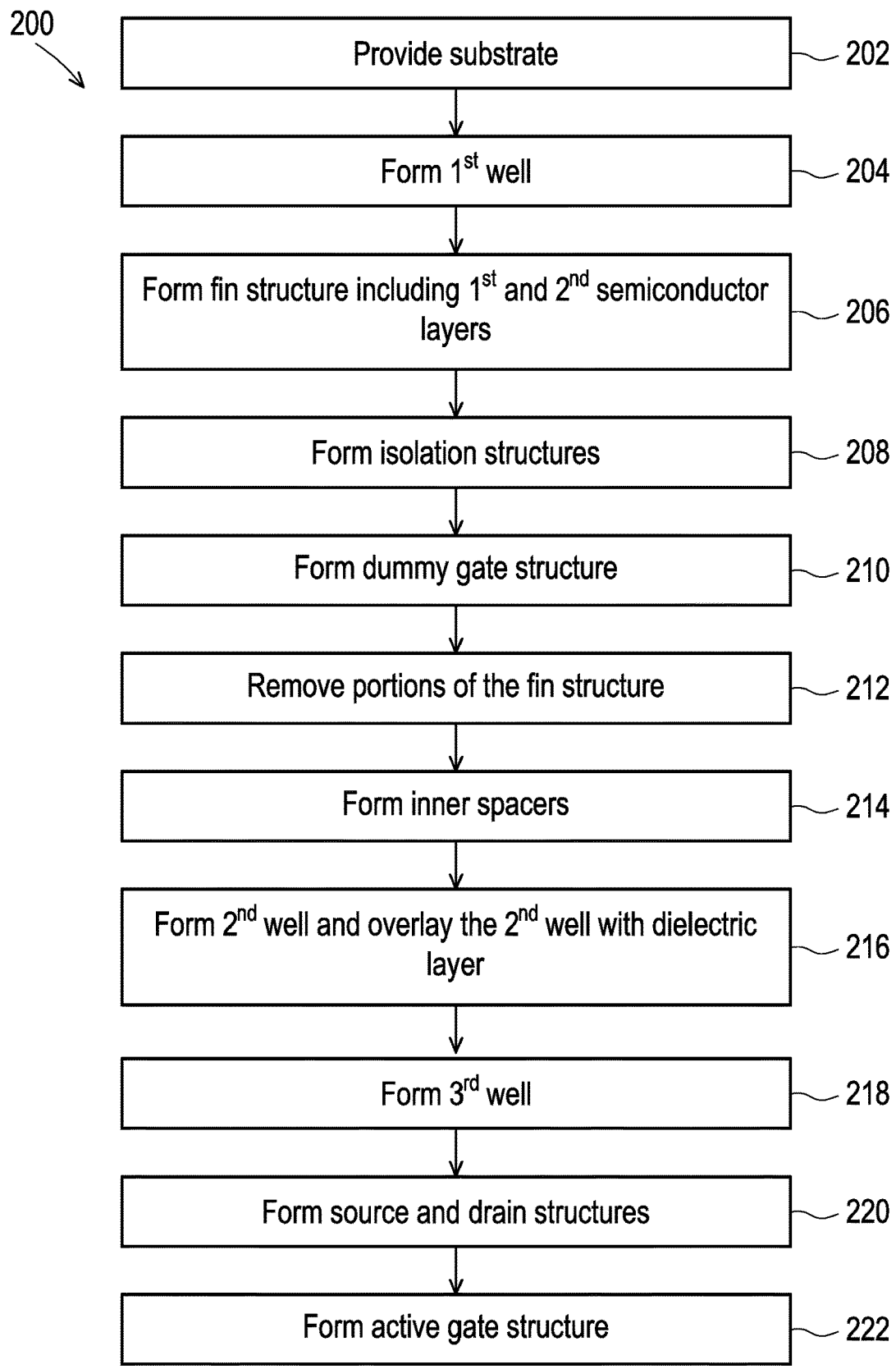
FIG. 2 is an example flow chart of a method for fabricating a semiconductor device, in accordance with some embodiments.

FIG. 2 illustrates a flowchart of a method 200 to form a nanostructure FET device, according to one or more embodiments of the present disclosure. For example, at least some of the operations (or steps) of the method 200 can be used to form a FinFET device, a GAA FET device (e.g., GAA FET device 100), a nanosheet transistor device, a nanowire transistor device, a vertical transistor device, a bipolar junction transistor device, a diode device, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example GAA FET device at various fabrication stages as shown in FIGS. 3, 4, 5, 6, 7, 8, 9, 10, 11, 12, and 13, respectively, which will be discussed in further detail below.

In brief overview, the method 200 starts with operation 202 of providing a substrate. The method 200 continues to operation 204 of forming a first semiconductor well. The method 200 continues to operation 206 of forming a fin structure including a number of first semiconductor layers and a number of second semiconductor layers. The method 200 continues to operation 208 of forming one or more isolation structures. The method 200 continues to operation 210 of forming a dummy gate structure. The method 200 continues to operation 212 of removing portions of the fin structure. The method 200 continues to operation 214 of forming inner spacers. The method 200 continues to operation 216 of forming a second semiconductor well and overlaying the second semiconductor well with a dielectric layer. The method 200 continues to operation 218 of forming a third semiconductor well. The method 200 continues to operation 220 of forming a source structure and a drain structure. The method 200 continues to operation 222 of forming an active gate structure.

As mentioned above, FIGS. 3-13 each illustrate, in a cross-sectional view, a portion of a GAA FET device 300 at various fabrication stages of the method 200 of FIG. 2. The GAA FET device 300 is similar to the GAA FET device 100 shown in FIG. 1, in accordance with various embodiments. It should be understood the GAA FET device 300 may further include a number of other devices (not shown in the following figures) such as inductors, fuses, capacitors, coils, etc., while remaining within the scope of the present disclosure.

Figure 3:
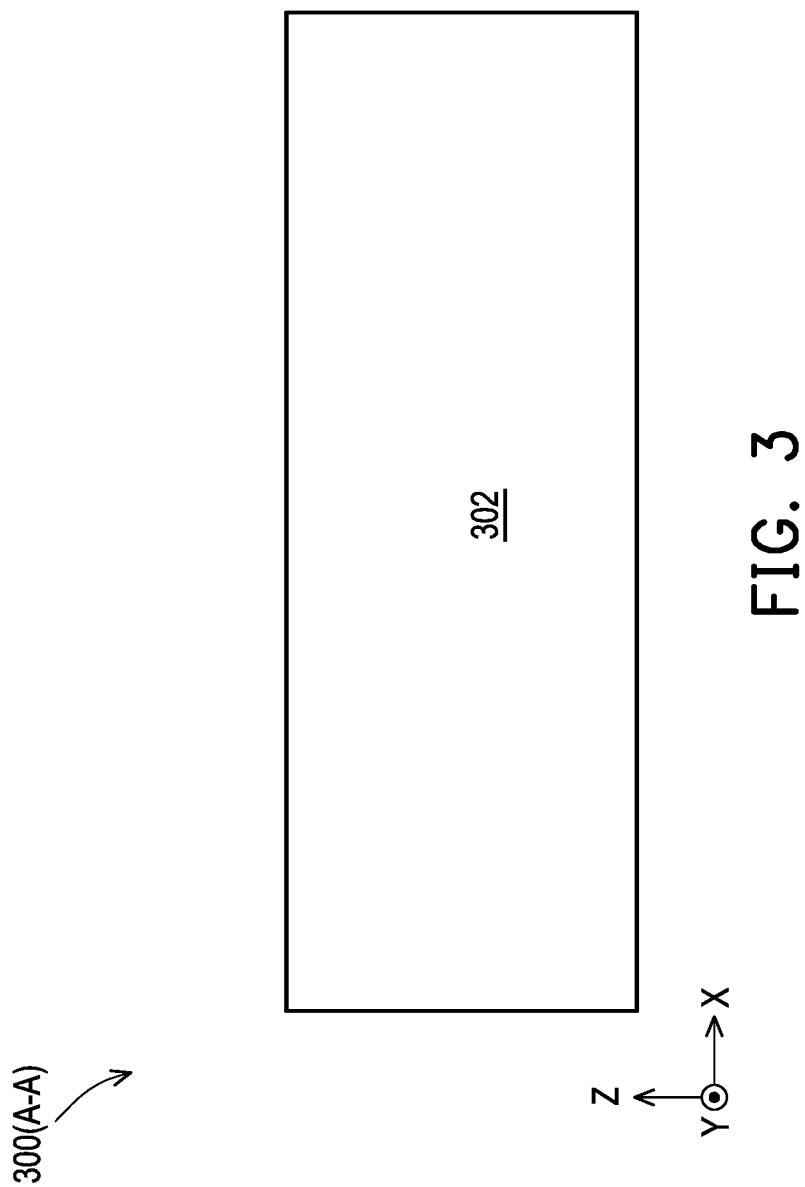
FIGS. 3, 4, 5, 6, 7, 8, 9, 10, 11, 12, and 13 illustrate cross-sectional views of an example semiconductor device during various fabrication stages, made by the method of FIG. 2, in accordance with some embodiments.

Corresponding to operation 202 of FIG. 2, FIG. 3 is a cross-sectional view of the GAA FET device 300 including a semiconductor substrate 302 at one of the various stages of fabrication. The cross-sectional view of FIG. 3 is cut in a direction along the lengthwise direction of an active/dummy gate structure of the GAA FET device 300 (e.g., cross-section A-A indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
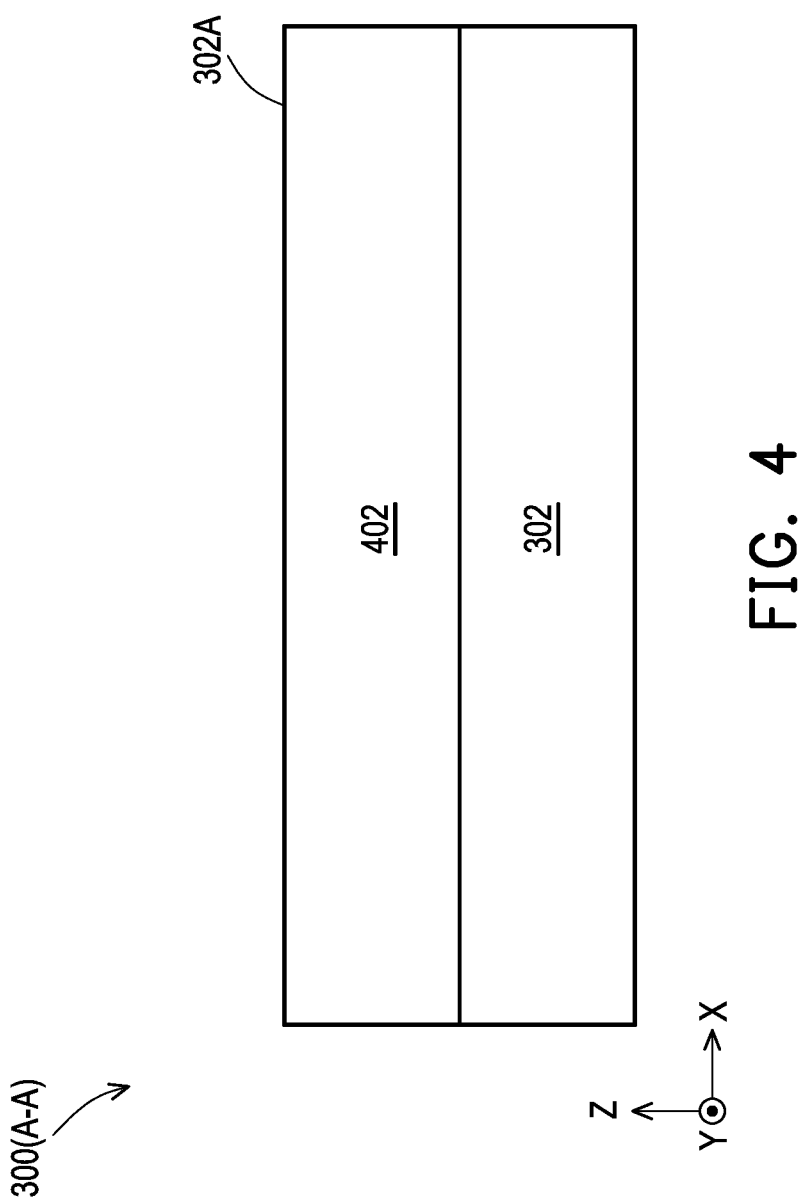

Corresponding to operation 204 of FIG. 2, FIG. 4 is a cross-sectional view of the GAA FET device 300 including a semiconductor well 402 at one of the various stages of fabrication. The cross-sectional view of FIG. 4 is cut in a direction along the lengthwise direction of an active/dummy gate structure of the GAA FET device 300 (e.g., cross-section A-A indicated in FIG. 1).

In some embodiments, the semiconductor well 402 may be formed as a region along a top surface (302A) of the substrate 302. For example, the semiconductor well 402 may extend from the top surface 302A into the substrate 302 with a certain depth. Further, the semiconductor well 402 can have a conductive type depending on design requirements. For example, to form a p-type GAA FET device, the semiconductor well 402 may be an n-well which is doped with n-type dopants; and to form an n-type GAA FET device, the semiconductor well 402 may be a p-well which is doped with p-type dopants. The p-type dopants may be boron or $BF_2$ or combinations thereof while the n-type dopants may be phosphorus, arsenic or combinations thereof. In the following discussions with respect to FIGS. 3-13, the semiconductor well 402 is a p-well, and thus, is sometimes referred to as "p-well 402."

Figure 5:
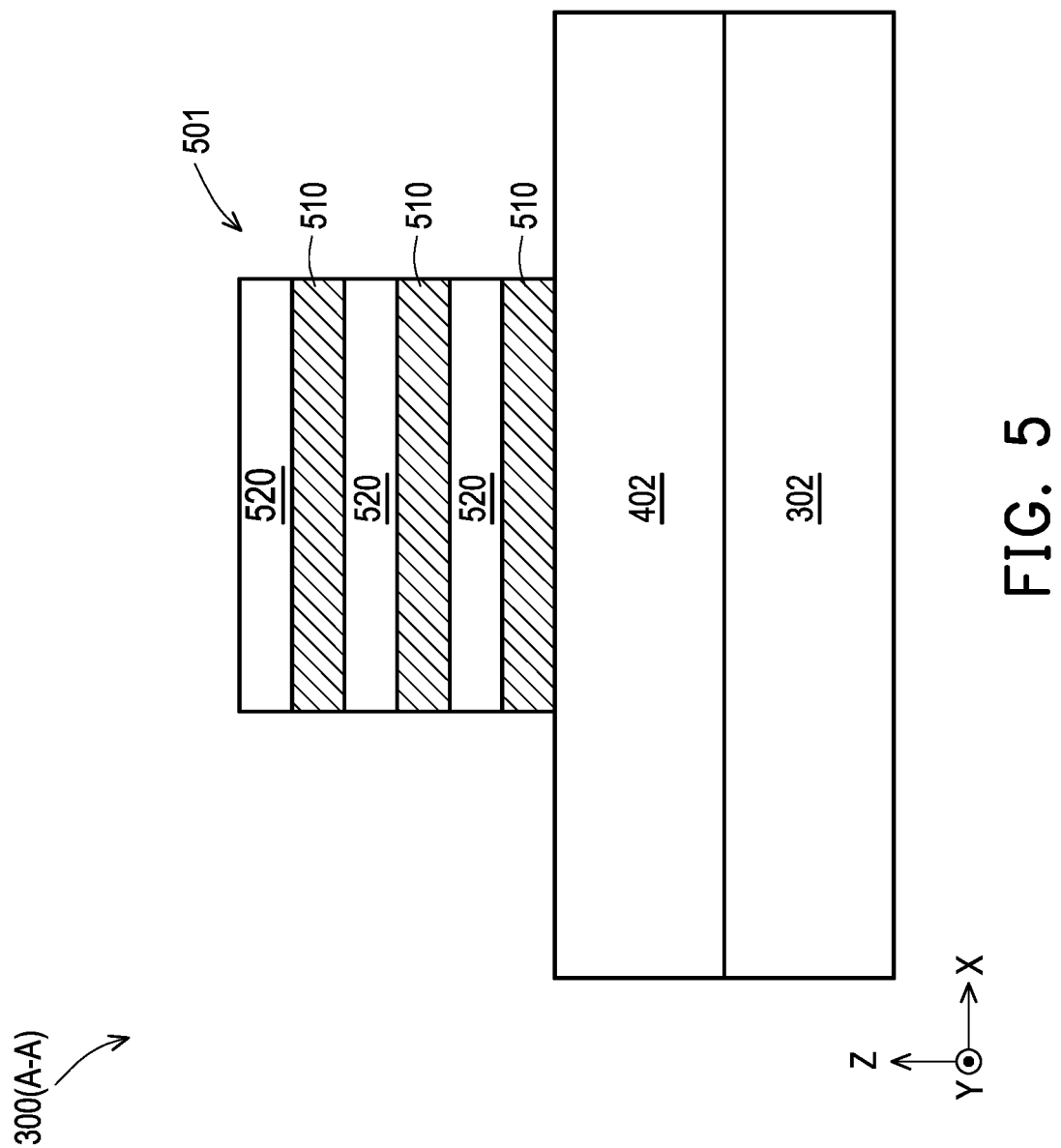

Corresponding to operation 206 of FIG. 2, FIG. 5 is a cross-sectional view of the GAA FET device 300 including a number of first semiconductor layers 510 and a number of second semiconductor layers 520 formed on the p-well 402 at one of the various stages of fabrication. The cross-sectional view of FIG. 5 is cut in a direction along the lengthwise direction of an active/dummy gate structure of the GAA FET device 300 (e.g., cross-section A-A indicated in FIG. 1).

The first semiconductor layers 510 and the second semiconductor layers 520 are alternatingly disposed on top of one another (e.g., along the Z direction) to form a stack. For example, one of the second semiconductor layers 520 is disposed over one of the first semiconductor layers 510 then another one of the first semiconductor layers 510 is disposed over the second semiconductor layer 520, so on and so forth. The stack may include any number of alternately disposed first and second semiconductor layers 510 and 520. For example in FIG. 5, the stack includes 3 first semiconductor layers 510, with 3 second semiconductor layers 520 alternatingly disposed therebetween and with one of the second semiconductor layers 510 being the topmost semiconductor layer. It should be understood that the GAA FET device 300 can include any number of first semiconductor layers and any number of second semiconductor layers, with either one of the first or second semiconductor layers being the topmost semiconductor layer, while remaining within the scope of the present disclosure.

The semiconductor layers 510 and 520 may have respective different thicknesses. Further, the first semiconductor layers 510 may have different thicknesses from one layer to another layer. The second semiconductor layers 520 may have different thicknesses from one layer to another layer. The thickness of each of the semiconductor layers 510 and 520 may range from few nanometers to few tens of nanometers. The first layer of the stack may be thicker than other semiconductor layers 510 and 520. In an embodiment, each of the first semiconductor layers 510 has a thickness ranging from about 5 nanometers (nm) to about 20 nm, and each of the second semiconductor layers 520 has a thickness ranging from about 5 nm to about 20 nm.

The semiconductor layers 510 and 520 have different compositions. In various embodiments, the semiconductor layers 510 and 520 have compositions that provide for different oxidation rates and/or different etch selectivity between the layers. In an embodiment, the first semiconductor layers 510 include silicon germanium ($Si_{1-x}Ge_x$), and the second semiconductor layers 520 include silicon (Si). In an embodiment, each of the second semiconductor layers 520 is silicon that may be undoped or substantially dopant-free (i.e., having an extrinsic dopant concentration from about 0 cm 3 to about $1 \times 10^{17}$ $cm^{-3}$), where for example, no intentional doping is performed when forming the second semiconductor layers 520 (e.g., of silicon).

In some embodiments, each of the semiconductor layers 510 is $Si_{1-x}Ge_x$ that includes less than 50% (x<0.5) Ge in molar ratio. For example, Ge may comprise about 15% to 35% of the semiconductor layers 510 of $Si_{1-x}Ge_x$ in molar ratio. Furthermore, the first semiconductor layers 510 may include different compositions among them, and the second semiconductor layers 520 may include different compositions among them. Either of the semiconductor layers 510 and 520 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 510 and 520 may be chosen based on providing differing oxidation rates and/or etch selectivity.

The semiconductor layers 510 and 520 can be epitaxially grown from the semiconductor substrate 302 (or the p-well 402). For example, each of the semiconductor layers 510 and 520 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor substrate 302 (or the p-well 402) extends upwardly, resulting in the semiconductor layers 510 and 520 having the same crystal orientation with the semiconductor substrate 302 (or the p-well 402).

Upon growing the semiconductor layers 510 and 520 on the semiconductor substrate 302 (as a stack), the stack may be patterned to form one or more fin structures (e.g., 501). Each of the fin structures is elongated along a lateral direction (e.g., the Y direction), and includes a stack of patterned semiconductor layers 510-520 interleaved with each other. The fin structure 501 is formed by patterning the semiconductor layers 510-520 using, for example, photolithography and etching techniques. For example, a mask layer (which can include multiple layers such as, for example, a pad oxide layer and an overlying pad nitride layer) is formed over the topmost semiconductor layer (e.g., 520). The pad oxide layer may be a thin film comprising silicon oxide formed, for example, using a thermal oxidation process. The pad oxide layer may act as an adhesion layer between the topmost semiconductor layer 520 and the overlying pad nitride layer. In some embodiments, the pad nitride layer is formed of silicon nitride, silicon oxynitride, silicon carbonitride, the like, or combinations thereof. The pad nitride layer may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask.

The patterned mask can be subsequently used to pattern exposed portions of the semiconductor layers 510-520 to form trenches (or openings), thereby defining the fin structure 501 between adjacent trenches. When multiple fin structures are formed, such a trench may be disposed between any adjacent ones of the fin structures. In some embodiments, the fin structure 501 is formed by etching trenches in the semiconductor layers 510-520 using, for example, reactive ion etch (RIE), neutral beam etch (NBE), the like, or combinations thereof. The etch may be anisotropic. In some embodiments, the trenches may be strips (when viewed from the top) parallel to each other, and closely spaced with respect to each other. In some embodiments, the trenches may be continuous and surround the fin structure 501.

Figure 6:
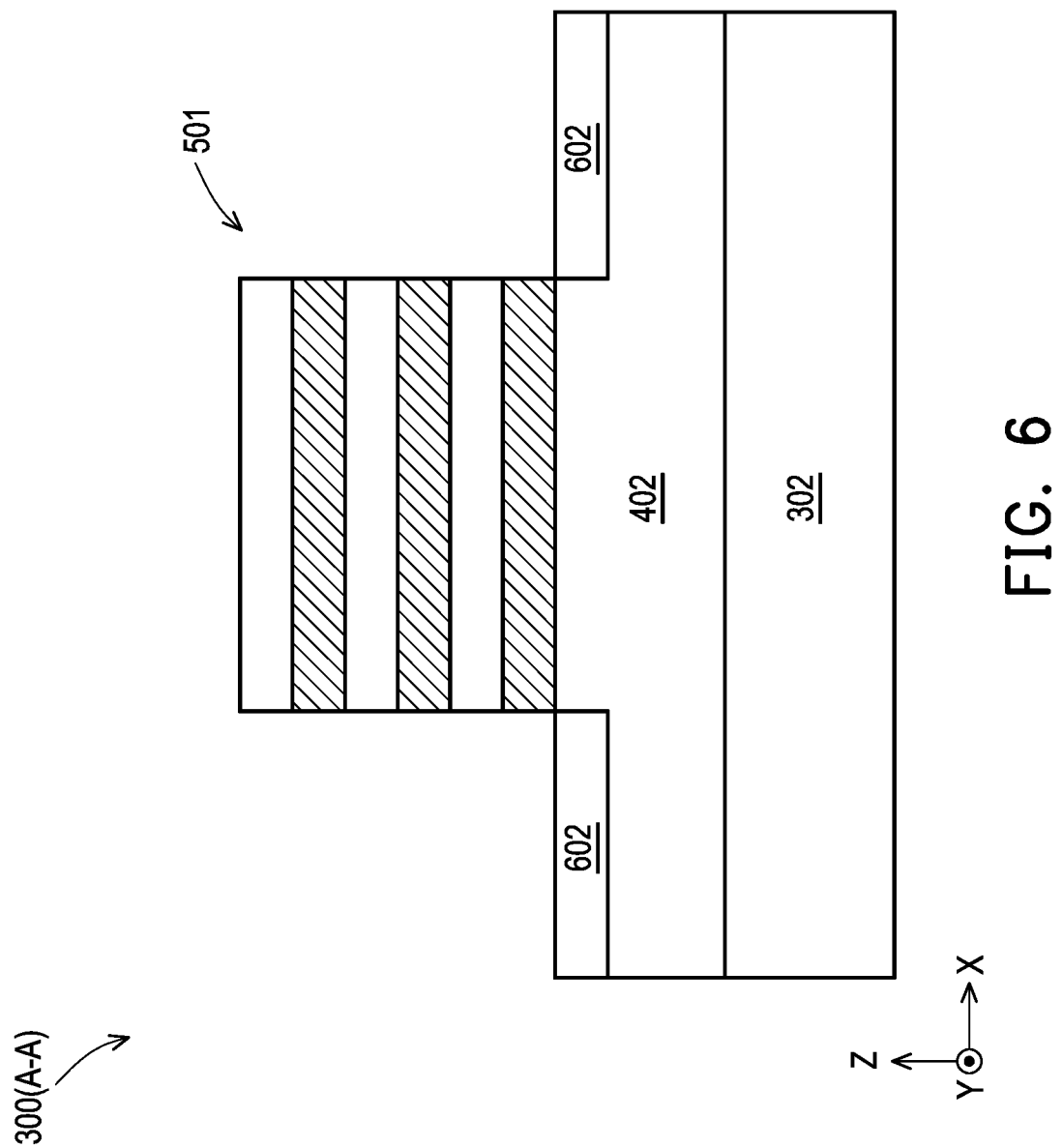

Corresponding to operation 208 of FIG. 2, FIG. 6 is a cross-sectional view of the GAA FET device 300 including one or more isolation structures 602, at one of the various stages of fabrication. The cross-sectional view of FIG. 6 is cut in a direction along the lengthwise direction of an active/dummy gate structure of the GAA FET device 300 (e.g., cross-section A-A indicated in FIG. 1).

The isolation structure 602, which can includes multiple portions, may be formed between adjacent fin structures, or next to a single fin structure. The isolation structure 602, which are formed of an insulation material, can electrically isolate neighboring fin structures from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP) process, may remove any excess insulation material and form a top surface of the insulation material and a top surface of a patterned mask (not shown) defining the fin structure 501. The patterned mask may also be removed by the planarization process, in various embodiments.

Next, the insulation material is recessed to form the isolation structure 602, as shown in FIG. 6, which is sometimes referred to as a shallow trench isolation (STI). The isolation structure 602 is recessed such that the fin structure 501 protrudes from between neighboring portions of the isolation structure 602. The top surface of the isolation structures (STIs) 602 may have a flat surface (as illustrated), a convex surface, a concave surface (such as dishing), or combinations thereof. The top surface of the isolation structure 602 may be formed flat, convex, and/or concave by an appropriate etch. The isolation structure 602 may be recessed using an acceptable etching process, such as one that is selective to the material of the isolation structure 602. For example, a dry etch or a wet etch using dilute hydrofluoric (DHF) acid may be performed to recess the isolation structure 602.

Figure 7:
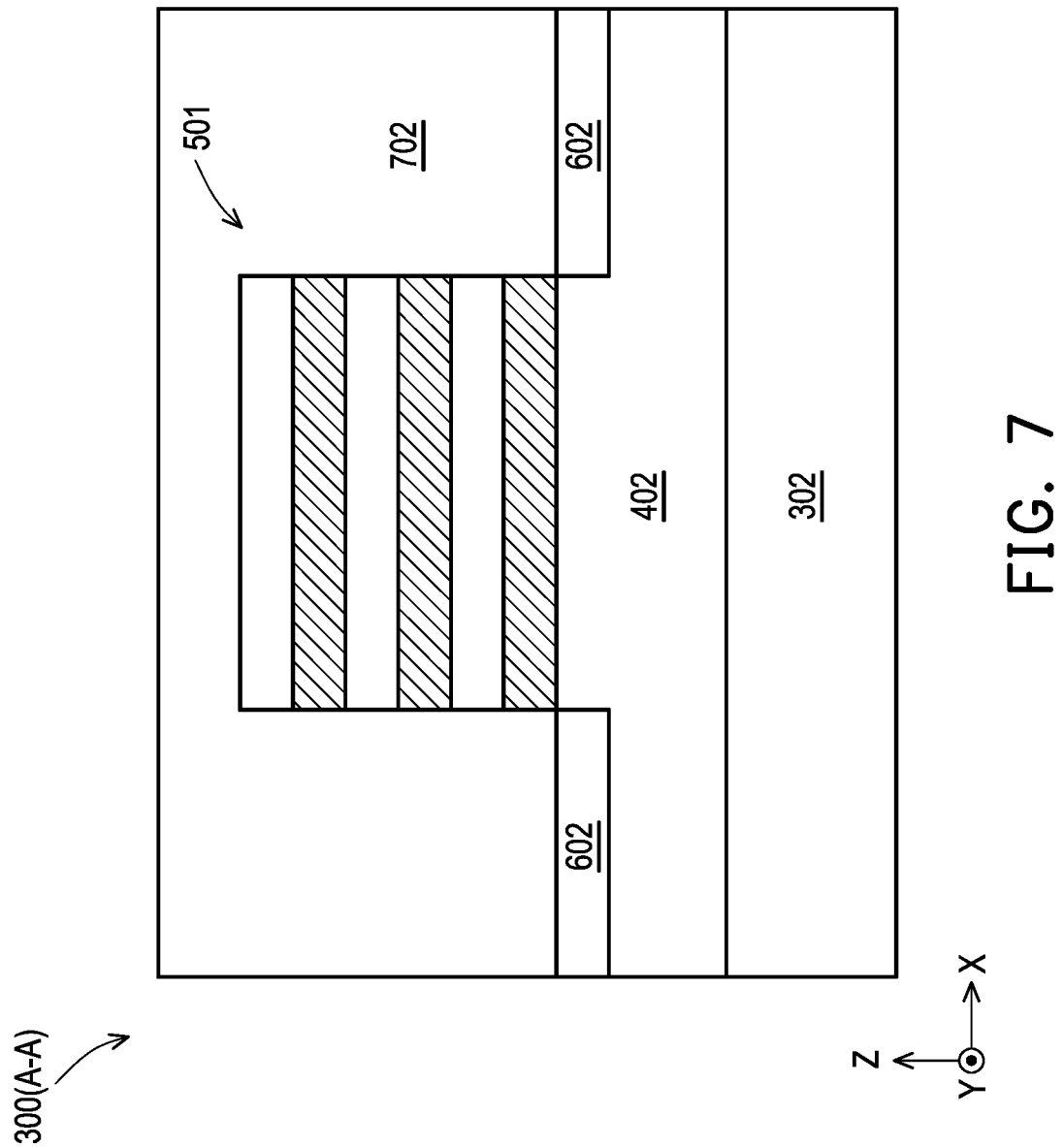

Corresponding to operation 210 of FIG. 2, FIG. 7 is a cross-sectional view of the GAA FET device 300 including a dummy gate structure 702, at one of the various stages of fabrication. The cross-sectional view of FIG. 7 is cut in a direction along the lengthwise direction of an active/dummy gate structure of the GAA FET device 300 (e.g., cross-section A-A indicated in FIG. 1).

The dummy gate structure 702 is formed over the fin structure 501 and the isolation structure 602. The dummy gate structure 702 can extend along a lateral direction (e.g., the X direction) perpendicular to the lateral direction along which the fin structure 501 extends. The dummy gate structure 702 may be placed where an active (e.g., metal) gate structure is later formed, in various embodiments. In some embodiments, the dummy gate structure 702 is placed over a portion of fin structure 501. Such an overlaid portion of the fin structure 501 includes portions of the second semiconductor layers 520 that is later formed as a conduction channel, and portions of the first semiconductor layers 510 that are replaced with an active gate structure. As such, the active gate structure can wrap around each of the portions of the second semiconductor layers 520, which will be discussed in further detail below.

In some embodiments, the dummy gate structure 702 can include one or more Si-based or SiGe-based materials that are similar (or having similar etching rates) as the first semiconductor layers 510 such as, for example, SiGe. The dummy gate structure 702 may be deposited by CVD, PECVD, ALD, FCVD, or combinations thereof. Although the dummy gate structure 702 is shown as being formed as a single-piece in the illustrated embodiment of FIG. 7, it should be understood that the dummy gate structure 702 can be formed to have multiple portions, each of which may include respective different materials, while remaining within the scope of the present disclosure.

Figure 8:
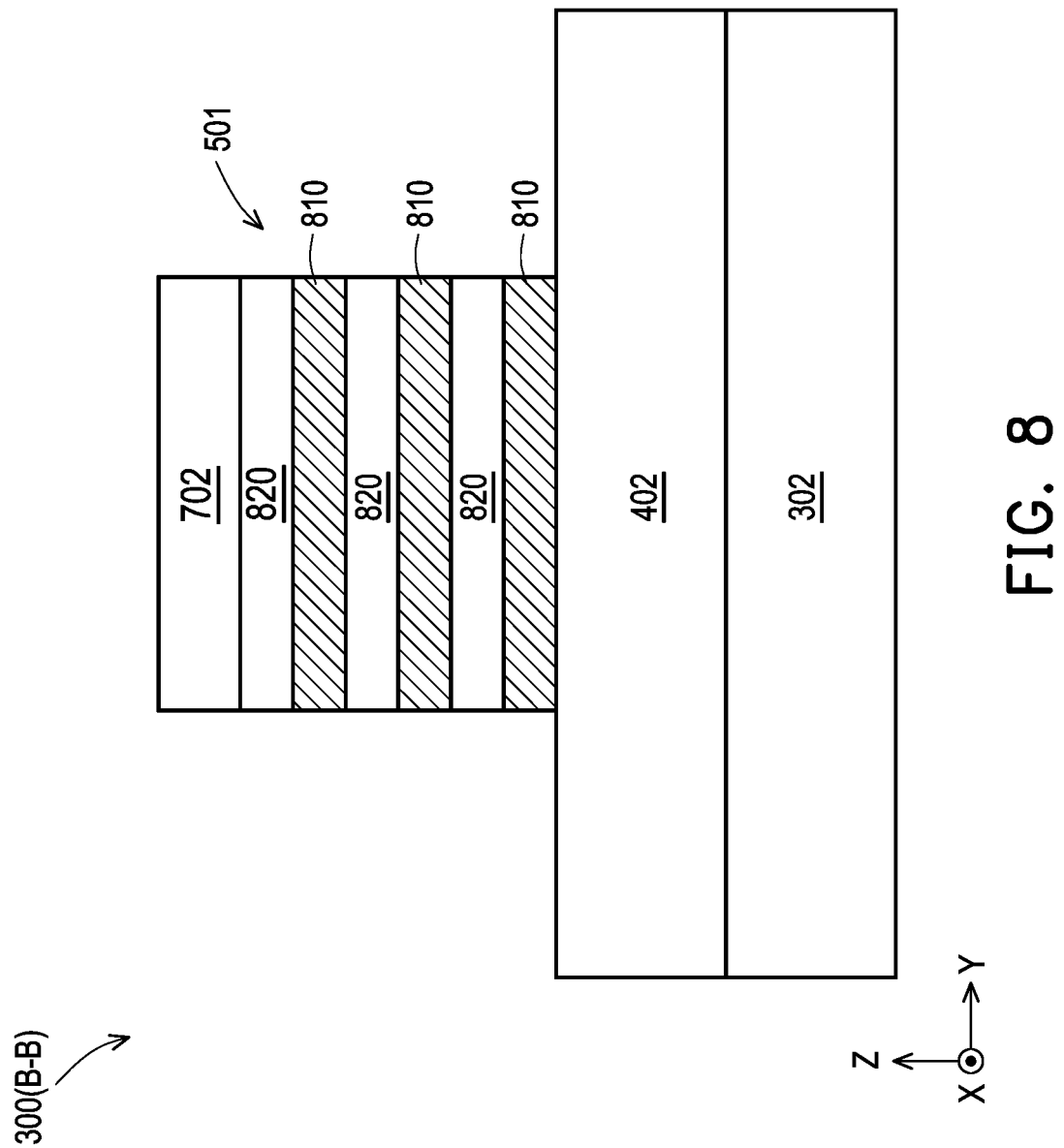

Corresponding to operation 212 of FIG. 2, FIG. 8 is a cross-sectional view of the GAA FET device 300 in which portions of the fin structure 501 that are not overlaid by the dummy gate structure 702 are removed, at one of the various stages of fabrication. The cross-sectional view of FIG. 8 is cut in the lengthwise direction perpendicular to the lengthwise direction of an active/dummy gate structure of the GAA FET device 300 (e.g., cross-section B-B indicated in FIG. 1).

The dummy gate structure 702 can serve as a mask to etch the non-overlaid portions of the fin structure 501, which results in the "patterned" fin structure 501 having one or more alternatingly stacks including remaining portions of the semiconductor layers 510 and 520. As a result, along the Z direction, newly formed sidewalls of the patterned fin structure 501 are aligned with sidewalls of the dummy gate structure 702. For example in FIG. 8, semiconductor layers 810 and 820 are the remaining portions of the semiconductor layers 510 and 520 overlaid by the dummy gate structure 702, respectively. In some embodiments, the semiconductor layers 810 and 820 may sometimes be referred to as nanostructures (e.g., nanosheets) 810 and 820, respectively.

Figure 9:
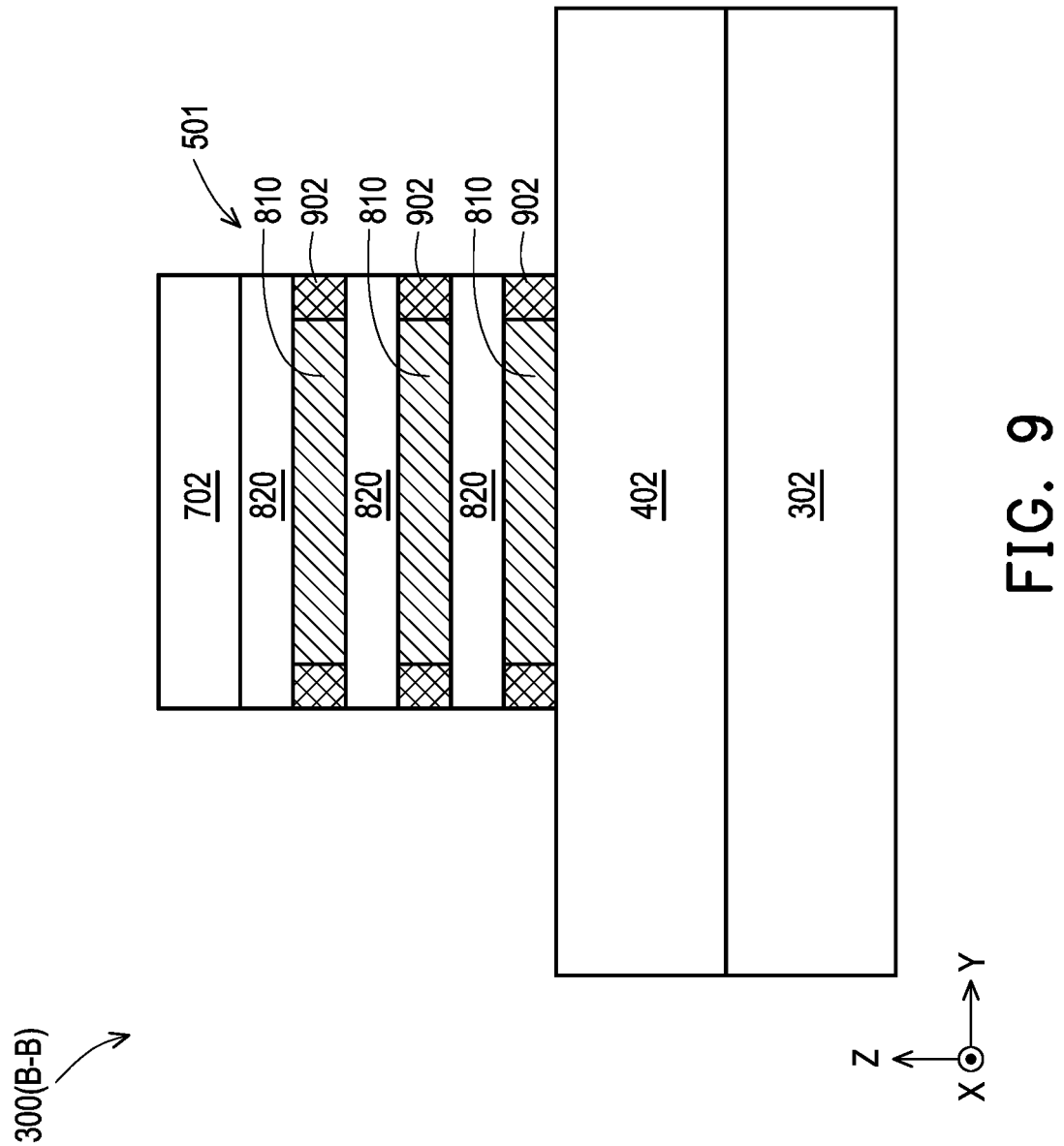

Corresponding to operation 214 of FIG. 2, FIG. 9 is a cross-sectional view of the GAA FET device 300 including inner spacers 902, at one of the various stages of fabrication. The cross-sectional view of FIG. 9 is cut in the lengthwise direction perpendicular to the lengthwise direction of an active/dummy gate structure of the GAA FET device 300 (e.g., cross-section B-B indicated in FIG. 1).

To form the inner spacers 902, respective end portions of each of the nanostructures 810 are removed. The end portions of the nanostructures 810 can be removed (e.g., etched) using a "pull-back" process to pull the nanostructures 810 back by a pull-back distance. In an example where the semiconductor layers 820 include Si, and the semiconductor layers 810 include SiGe, the pull-back process may include a hydrogen chloride (HCl) gas isotropic etch process, which etches SiGe without attacking Si. As such, the Si layers (nanostructures) 820 may remain intact during this process.

Accordingly, a number of recess, each inwardly extending from exposed sidewalls of a corresponding nanostructure 810, can be formed. Next, the recesses are filled with a dielectric material to form the inner spacers 902. For example, the inner spacers 902 can be formed conformally by chemical vapor deposition (CVD), or by monolayer doping (MLD) of nitride followed by spacer RIE. The inner spacer 902 can be deposited using, e.g., a conformal deposition process and subsequent isotropic or anisotropic etch back to remove excess spacer material on the sidewalls of the stacks of the fin structure 501 and on a surface of the semiconductor substrate 302 (or p-well 402). The dielectric material, used to form the inner spacer 902, include silicon nitride, silicoboron carbonitride, silicon carbonitride, silicon carbon oxynitride, or any other type of dielectric material (e.g., a dielectric material having a dielectric constant k of less than about 5) appropriate to the role of forming an insulating gate sidewall spacers of transistors.

Figure 10:
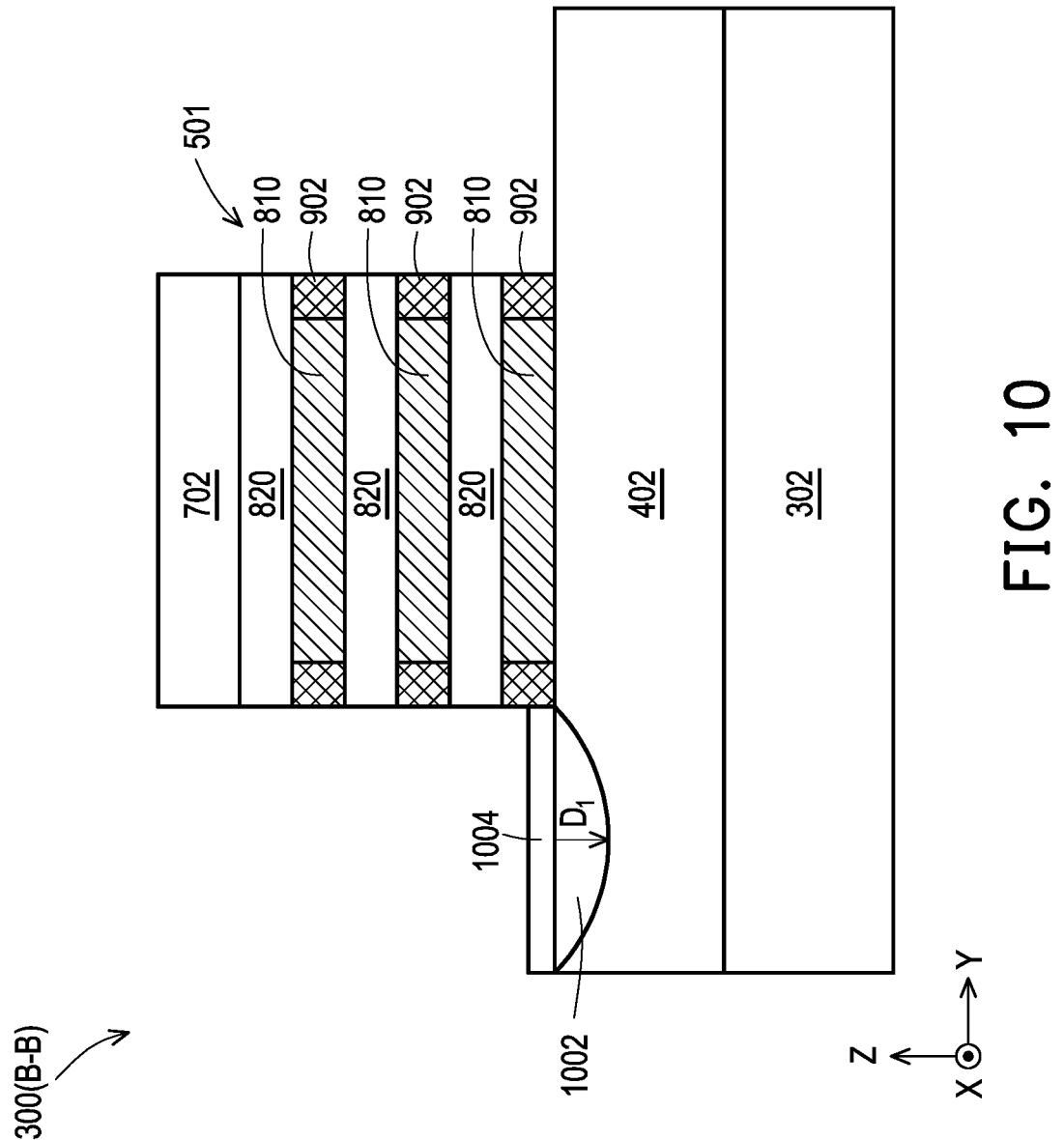

Corresponding to operation 216 of FIG. 2, FIG. 10 is a cross-sectional view of the GAA FET device 300 including a semiconductor well 1002 and a dielectric layer 1004 overlaying the semiconductor well 1002, at one of the various stages of fabrication. The cross-sectional view of FIG. 10 is cut in the lengthwise direction perpendicular to the lengthwise direction of an active/dummy gate structure of the GAA FET device 300 (e.g., cross-section B-B indicated in FIG. 1).

In various embodiments, the semiconductor well 1002 and dielectric layer 1004 are formed on one side of the fin structure 501 along the lengthwise direction of fin structure 501 (e.g., the Y direction), while the other side of the fin structure 501 may be blocked. For example, with the other side of the fin structure 501 being blocked (or otherwise masked), the semiconductor well 1002 is formed in the p-well 402 (e.g., through an implant process) with dopants having a conductive type opposite to the conductive type of dopants in the p-well 402, i.e., n-type dopants. Further, the semiconductor well 1002 may have a substantially higher doping concentration than the p-well 402. Accordingly, the semiconductor well 1002 is sometimes referred to as "$n^+$-well 1002." As shown, the $n^+$-well 1002 may extend into the p-well 402 with a depth, "$D_1$." Next, the dielectric layer 1004 is formed to overlay the $n^+$-well 1002. In some embodiments, the dielectric layer 1004 is formed of silicon nitride, silicon oxynitride, silicon carbonitride, the like, or combinations thereof. The dielectric layer 1004 may be formed using low-pressure chemical vapor deposition (LPCVD) or plasma enhanced chemical vapor deposition (PECVD), for example. As an example, the dielectric layer 1004 may be formed as a conformal layer with a thickness in the range of about 5 nm to about 20 nm.

Figure 11:
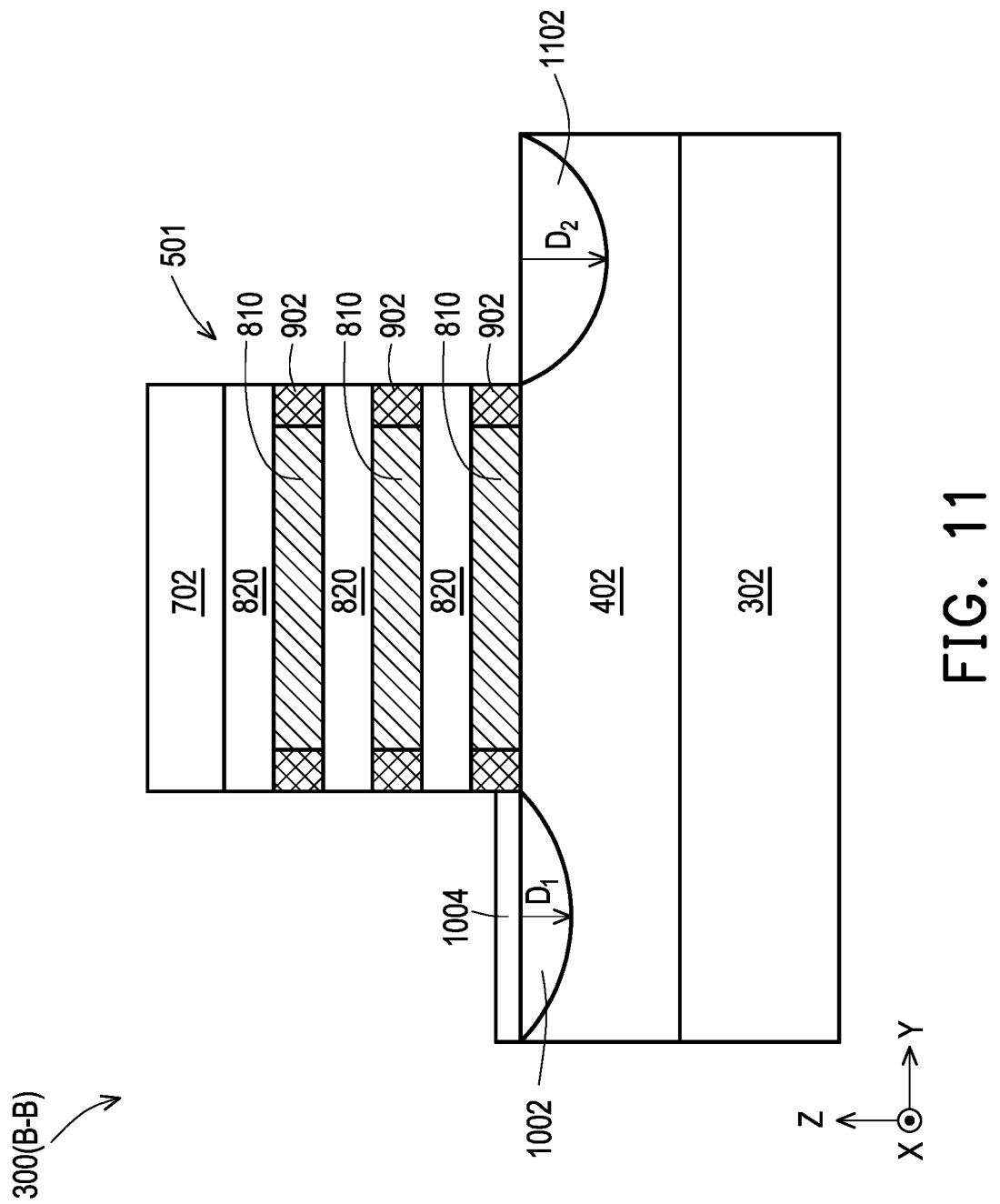

Corresponding to operation 218 of FIG. 2, FIG. 11 is a cross-sectional view of the GAA FET device 300 including a semiconductor well 1102, at one of the various stages of fabrication. The cross-sectional view of FIG. 11 is cut in the lengthwise direction perpendicular to the lengthwise direction of an active/dummy gate structure of the GAA FET device 300 (e.g., cross-section B-B indicated in FIG. 1).

Upon overlaying the n"-well 1002 with the dielectric layer 1004 on one side of the fin structure 501, the semiconductor well 1102 is formed on the other side of the fin structure 501 along the lengthwise direction of fin structure 501 (e.g., the Y direction), while the n"-well 1002 may be blocked. For example, with the n"-well 1002 being blocked (or otherwise masked), the semiconductor well 1102 is formed in the p-well 402 (e.g., through an implant process) with dopants having a conductive type opposite to the conductive type of dopants in the p-well 402, i.e., n-type dopants. Further, the semiconductor well 1102 may have a substantially higher doping concentration than the p-well 402. Accordingly, the semiconductor well 1102 is sometimes referred to as "$n^+$-well 1102." As shown, the $n^+$-well 1102 may extend into the p-well 402 with a depth, "$D_2$." In various embodiments, the depth $D_2$ is substantially greater than the depth $D_1$, for example, up to two times. Such an extended depth can improve an intrinsic gain of the GAA FET device 300, which will be discussed in further detail below.

Figure 12:
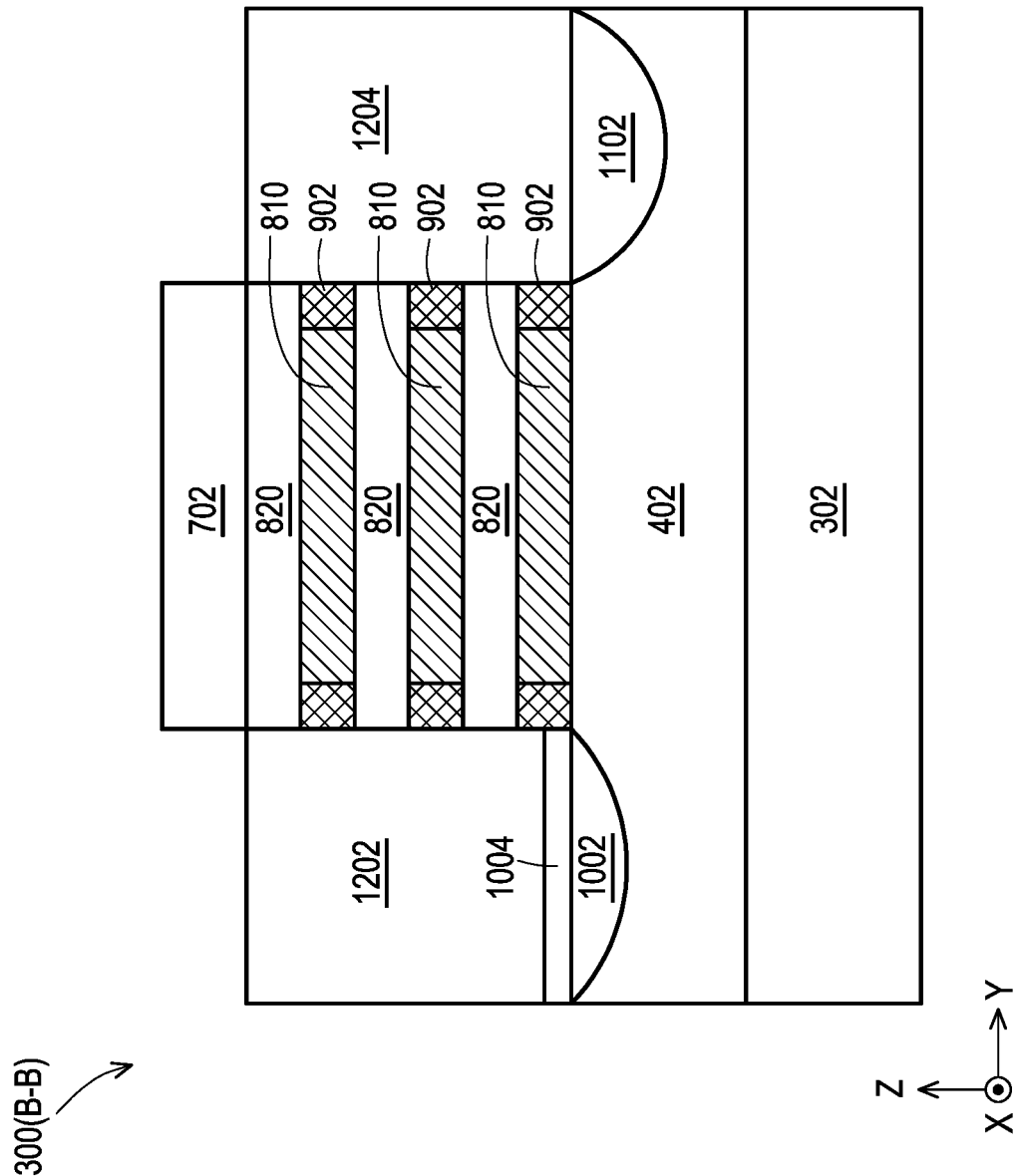

Corresponding to operation 220 of FIG. 2, FIG. 12 is a cross-sectional view of the GAA FET device 300 including epitaxial structures 1202 and 1204, at one of the various stages of fabrication. The cross-sectional view of FIG. 12 is cut in the lengthwise direction perpendicular to the lengthwise direction of an active/dummy gate structure of the GAA FET device 300 (e.g., cross-section B-B indicated in FIG. 1).

As shown, the epitaxial structures 1202 and 1204 are coupled to respective ends (along the Y direction) of the fin structure 501 (FIG. 11), e.g., the respective ends of each of the nanostructures 820. Further, the epitaxial structures 1202 and 1204 are separated (or otherwise isolated) from respective ends (along the Y direction) of the nanostructures 810 with the inner spacers 902.

The epitaxial structures 1202 and 1204 may each include silicon germanium (SiGe), indium arsenide (InAs), indium gallium arsenide (InGaAs), indium antimonide (InSb), gallium arsenide (GaAs), gallium antimonide (GaSb), indium aluminum phosphide (InAlP), indium phosphide (InP), any other suitable material, or combinations thereof. The epitaxial structures 1202 and 1204 may be formed using an epitaxial layer growth process on exposed ends of each of the nanostructures 820. For example, the growth process can include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epitaxial processes. In some embodiments, the epitaxial structure 1202 is formed above the $n^+$-well 1002, and further, the epitaxial structure 1202 is isolated from the $n^+$-well 1002 with the dielectric layer 1004. Alternatively stated, a bottom surface of the epitaxial structure 1202 is in contact with the dielectric layer 1004. And, the epitaxial structure 1204 is formed above the $n^+$-well 1102, and further, the epitaxial structure 1204 is (e.g., electrically) coupled to the $n^+$-well 1102. Alternatively stated, a bottom surface of the epitaxial structure 1204 is in contact with the $n^+$-well 1102.

In-situ doping (ISD) may be applied to form doped epitaxial structures 1202 and 1204, thereby creating the junctions for the GAA FET device 300. For example, when the GAA FET device 300 is configured in n-type, the epitaxial structures 1202 and 1204 can be doped by implanting n-type dopants, e.g., arsenic (As), phosphorous (P), etc., into them. When the GAA FET device 300 300 is configured in p-type, the epitaxial structures 1202 and 1204 can be doped by implanting p-type dopants, e.g., boron (B), etc., into them.

Figure 13:
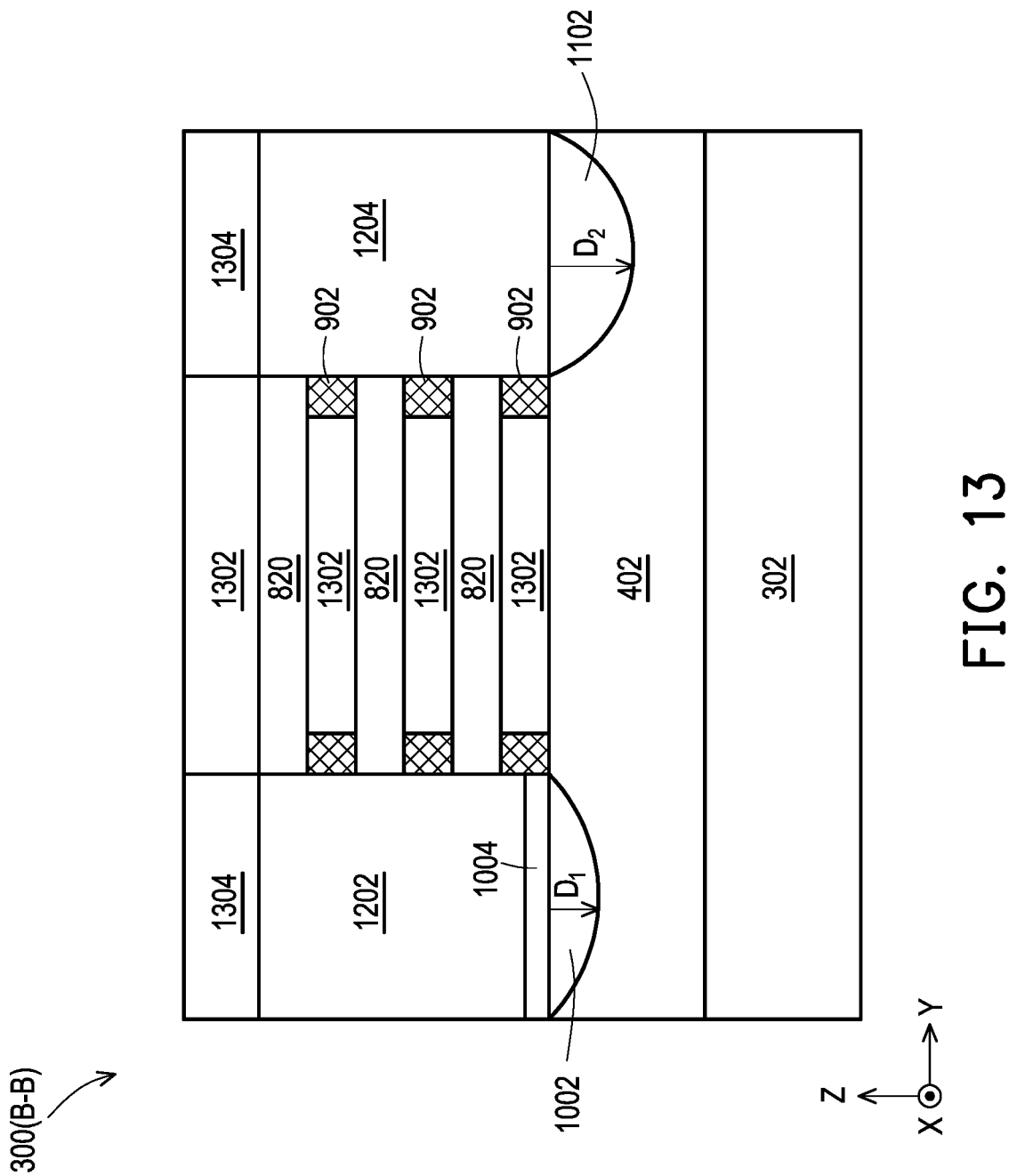

Corresponding to operation 222 of FIG. 2, FIG. 13 is a cross-sectional view of the GAA FET device 300 including an active gate structure 1302, at one of the various stages of fabrication. The cross-sectional view of FIG. 13 is cut in the lengthwise direction perpendicular to the lengthwise direction of an active/dummy gate structure of the GAA FET device 300 (e.g., cross-section B-B indicated in FIG. 1).

Following the formation of epitaxial structures 1202 and 1204, an interlayer dielectric (ILD) 1304 is formed over the epitaxial structures 1202 and 1204. Next, the dummy gate structure 702 and the nanostructures 810 may be concurrently removed. In various embodiments, the dummy gate structure 702 and the nanostructures 810 can be removed by applying a selective etch (e.g., a hydrochloric acid (HCl)), while leaving the nanostructures 820 substantially intact. After the removal of the dummy gate structure 702, a gate trench, exposing respective sidewalls of each of the nanostructures 820 that face the X direction, may be formed. After the removal of the nanostructures 810 to further extend the gate trench, respective bottom surface and/or top surface of each of the nanostructures 820 may be exposed. Consequently, a full circumference of each of the nanostructures 820 can be exposed. Next, the active gate structure 1302 is formed to wrap around each of the nanostructures 820.

The active gate structure 1302 includes a gate dielectric and a gate metal, in some embodiments. The gate dielectric can wrap around each of the nanostructures 820, e.g., the top and bottom surfaces and sidewalls facing the X direction). The gate dielectric may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric may include a stack of multiple high-k dielectric materials. The gate dielectric can be deposited using any suitable method, including, for example, molecular beam deposition (MBD), atomic layer deposition (ALD), PECVD, and the like. In some embodiments, the gate dielectric may optionally include a substantially thin oxide (e.g., $SiO_x$) layer, which may be a native oxide layer formed on the surface of each of the nanostructures 820.

The gate metal can wrap around each of the nanostructures 820 with the gate dielectric disposed therebetween. Specifically, the gate metal can include a number of gate metal sections abutted to each other along the Z direction. Each of the gate metal sections can extend not only along a horizontal plane (e.g., the plane expanded by the X direction and the Y direction), but also along a vertical direction (e.g., the Z direction). As such, two adjacent ones of the gate metal sections can adjoin together to wrap around a corresponding one of the nanostructures 820, with the gate dielectric disposed therebetween.

The gate metal may include a stack of multiple metal materials. For example, the gate metal may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process.

Upon forming the active gate structure 1302, a complete GAA FET may be defined, according to various embodiments of the present disclosure. For example, the epitaxial structure 1202, epitaxial structure 1204, active gate structure 1302, and nanostructures 820 can function as a drain structure (or terminal), a source structure (or terminal), a gate terminal, and a channel (structure) of that GAA FET, respectively. Accordingly, each of the epitaxial structure 1202, epitaxial structure 1204, and active gate structure 1302 can be coupled to at least one contact structure (not shown). In various embodiments, the GAA FET discussed above is an n-type GAA FET, where the channel (collectively constituted by the nanostructures 820) is configured to conduct electrons upon the GAA FET being turned on. However, it should be understood that the above-discussed configuration of the GAA FET can also form a p-type GAA FET as long as inversing the respective conductive types of its components. For example, in an embodiment where the GAA FET is configured as a p-type transistor, the well 402 may be an n-well, the wells 1002 and 1102 may each be a $p^+$-well, and the epitaxial structures 1202 and 1204 may each have a p-type conductivity.

Referring again to the example of the n-type GAA FET, the $n^+$-well 1102, coupled to the epitaxial structure 1204, has a conductive type opposite to the p-well 402, which causes a p-n junction formed at the interface of the $n^+$-well 1102 and p-well 402. This p-n junction can help release any plasma charge accumulated. Further, the $n^+$-well 1102 is formed with an extended depth ($D_2$). With such an extended $n^+$-well 1102 coupled to the source terminal of the transistor (epitaxial structure 1204), an intrinsic gain ($g_{ds}$) of the GAA FET can be advantageously increased. Generally, the intrinsic gain ($g_{ds}$) is positively proportional to the depth ($D_2$). These improvements make the disclosed GAA FET (or various other devices formed based on the similar configuration) a promising candidate for various analog-related applications.

Figure 14:
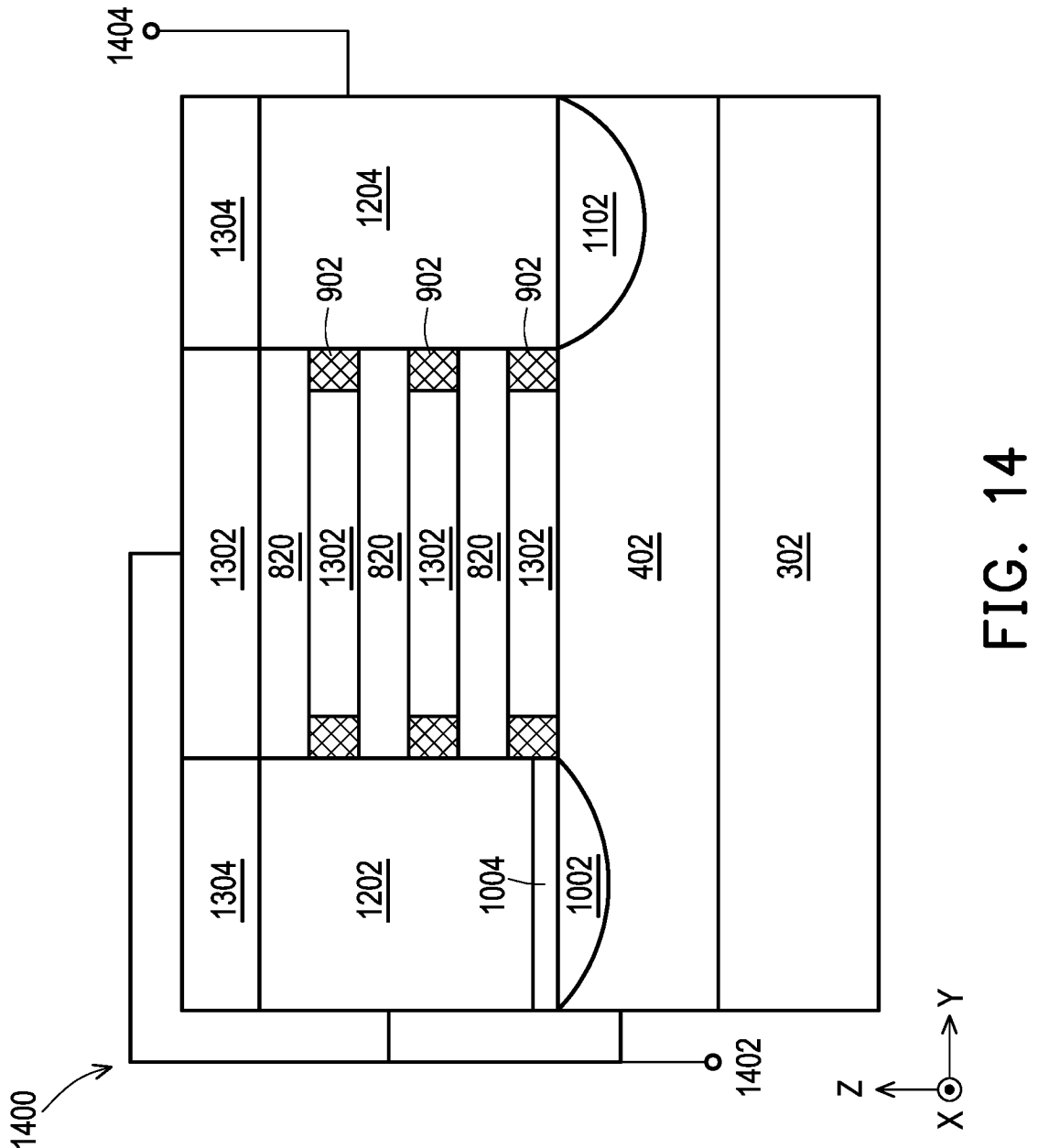
FIG. 14 illustrates another example semiconductor device that can be made by the method of FIG. 2, in accordance with some embodiments.

For example in FIG. 14, by coupling the active gate structure 1302, the epitaxial structure 1202 and the p-well 402 together to one negative terminal 1402, and coupling the epitaxial structure 1204 to one positive terminal 1404, respectively, the GAA FET can function as a diode (or antenna) 1400. With the asymmetrical configuration for the epitaxial structures 1202 and 1204 (as discussed above), which function as the negative terminal and positive terminal, respectively, the diode 1400 can effectively release undesired plasma charge on the positive terminal 1404.

Figure 15:
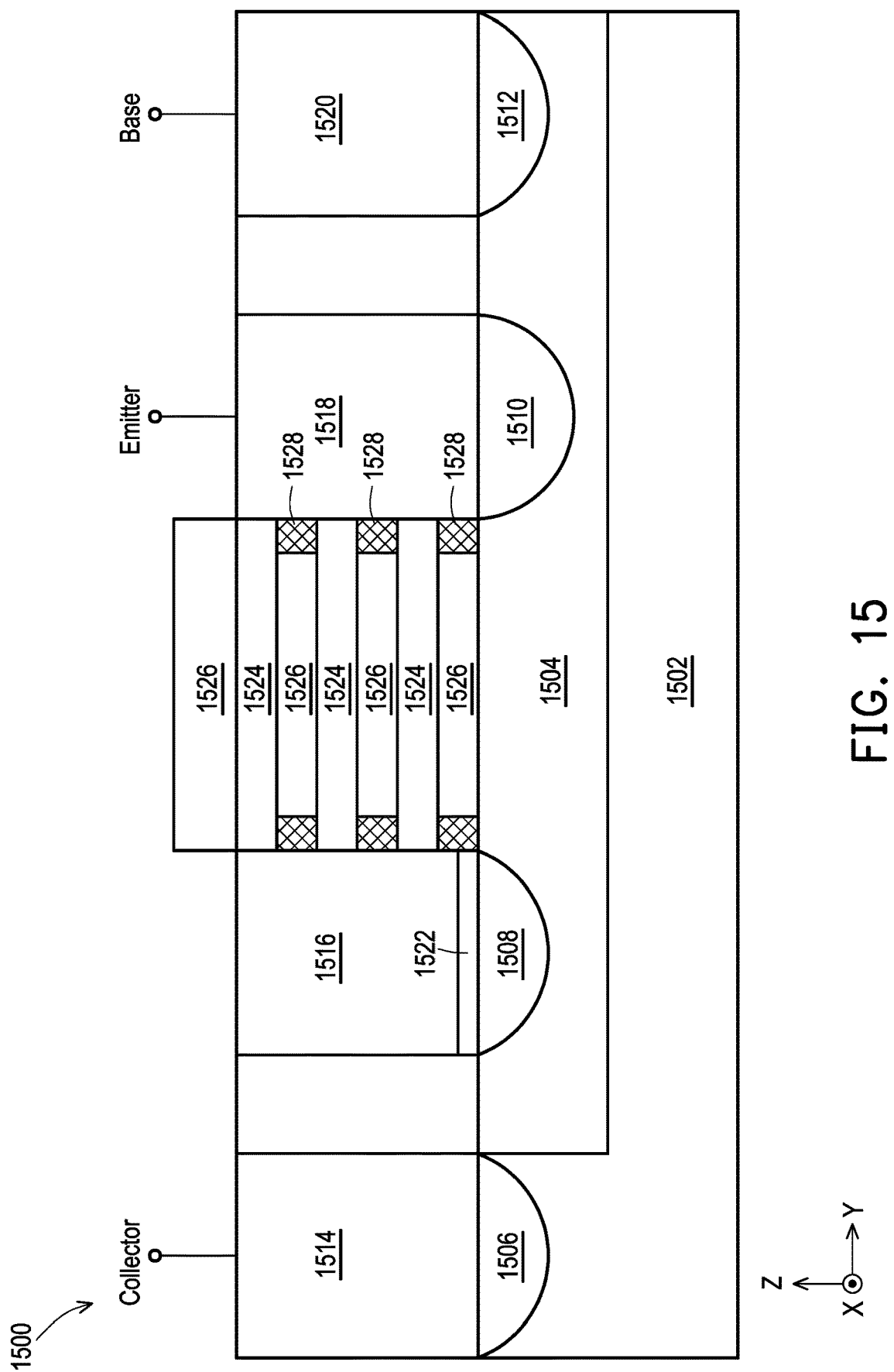
FIG. 15 illustrates yet another example semiconductor device that can be made by at least some of the operations of the method of FIG. 2, in accordance with some embodiments.

In another example, FIG. 15 illustrates a bipolar junction transistor (BJT) 1500 formed based on the similar configuration to the GAA FET of FIGS. 3-13. For example, the BJT 1500 may be formed by performing at least some of the operations of the method 200 of FIG. 2. Accordingly, configuration of the BJT 1500 is briefly described as follows. As shown, the BJT 1500 includes a substrate 1502, semiconductor wells 1504, 1506, 1508, 1510, and 1512, epitaxial structures 1514, 1516, 1518, and 1520, a dielectric layer 1522, nanostructures 1524, an active gate structure 1526, and inner spacers 1528. In some embodiments, the well 1504 is doped with n-type dopants (hereinafter "n-well 1504"), the wells 1506 to 1510 are each doped with a high concentration of p-type dopants (hereinafter "$p^+$-well 1506," "$p^+$-well 1508," and "$p^+$-well 1510," respectively), the well 1512 is doped with a high concentration of n-type dopants (hereinafter "$n^+$-well 1512"), the epitaxial structures 1514 to 1518 are each doped with p-type dopants, and the epitaxial structure 1520 is doped with n-type dopants. As such, the BJT 1500 may function as a PNP BJT, where the epitaxial structures 1514, 1518, and 1520 function as its collector terminal, emitter terminal, and base terminal, respectively. Similar as the discussion above with respect to the GAA FET, the illustrated PNP BJT 1500 can be configured as a NPN BJT by inversing the respective conductive types of its components, while remaining within the scope of the present disclosure.

Figure 16:
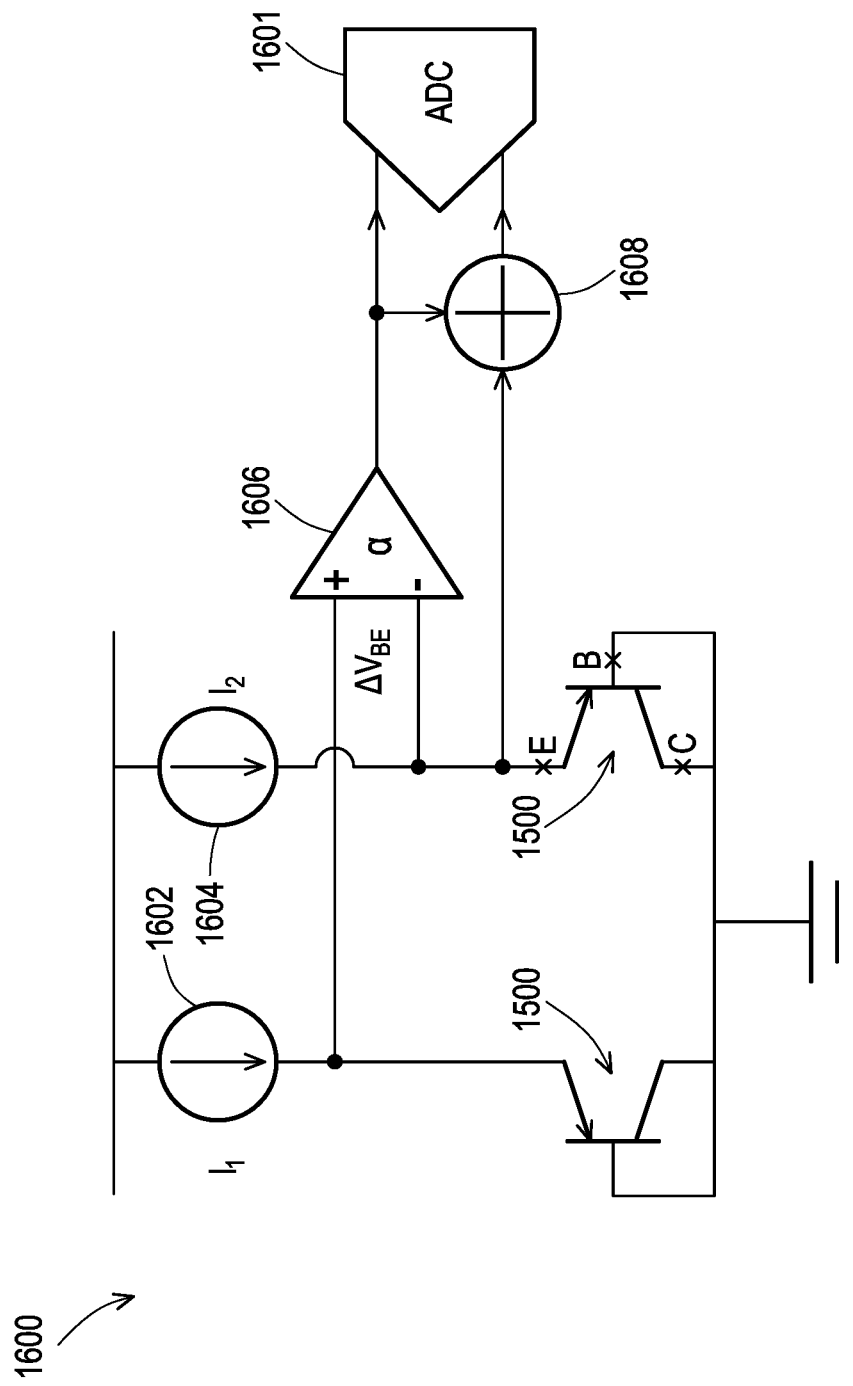
FIG. 16 illustrates a schematic diagram of a circuit that includes one or more of the semiconductor device of FIG. 15, in accordance with some embodiments.
Figure 17:
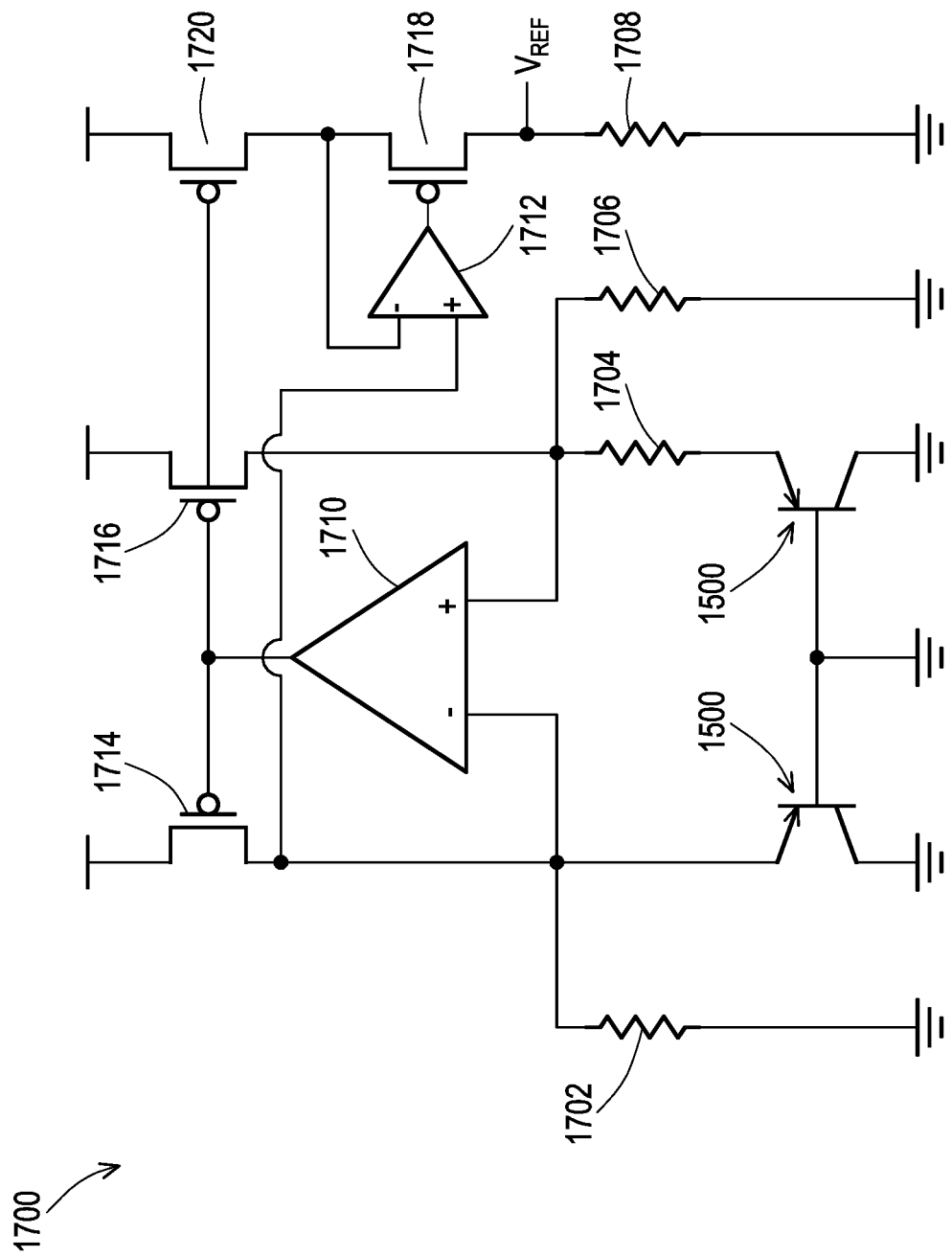
FIG. 17 illustrates a schematic diagram of another circuit that includes one or more of the semiconductor device of FIG. 15, in accordance with some embodiments.

FIGS. 16 and 17 illustrate schematic diagrams of example circuits 1600 and 1700 in which the BJT 1500 can be used to enhance their respective performance, in accordance with various embodiments of the present disclosure. The circuit 1600 is a BJT-based temperature sensor and the circuit 1700 is a BJT-based bandgap reference circuit, which will be briefly described as follows.

In FIG. 16, the circuit 1600 includes current sources 1602 and 1604 each of which is coupled to a corresponding one of the BJTs 1500, an amplifier 1606, an adder circuit 1608, and an analog to digital converter (ADC) 1610. Each of the BJTs 1500 has its collector terminal and base terminal tied together (sometimes referred to as diode-connected). A voltage difference, $\Delta V_{BE}$, present at respective emitter terminals of the BJTs 1500 is temperature dependent, e.g., kT/q ln p, where "p" represents a collector current-density ratio between the two BJTs 1500. It is understood by persons with ordinary skills in the art that one of the most important key parameters of a temperature sensor is its temperature coefficient (e.g., in the unit of μV/° C.), which is related (e.g., positively proportional) to such a voltage difference. By implementing the BJTs 1500 in the disclosed asymmetrical configuration, the voltage difference can be increased, which can in turn improve the temperature coefficient of the temperature sensor 1600.

In FIG. 17, the circuit 1700 includes resistors 1702, 1704, 1706, and 1708, amplifiers 1710 and 1712, (e.g., p-type) transistors 1714, 1716, 1718, and 1720. Each of the BJTs 1500 has its collector terminal and base terminal tied together (sometimes referred to as diode-connected). The circuit 1700 is configured to provide a reference voltage, $V_{REF}$, close to the theoretical 1.22 eV bandgap of silicon at 0 K based on the voltage difference present by those two BJTs 1500. Similarly, through implementing the BJTs 1500 in the disclosed asymmetrical configuration, the voltage difference can be increased, which can in turn improve a stability of $V_{REF}$ provided by the bandgap reference circuit 1700.

In one aspect of the present disclosure, a semiconductor device is disclosed. The semiconductor device includes a first semiconductor well. The semiconductor device includes a channel structure disposed above the first semiconductor well and extending along a first lateral direction. The semiconductor device includes a gate structure extending along a second lateral direction and straddling the channel structure. The semiconductor device includes a first epitaxial structure disposed on a first side of the channel structure. The semiconductor device includes a second epitaxial structure disposed on a second side of the channel structure, the first side and second side opposite to each other in the first lateral direction. The first epitaxial structure is electrically coupled to the first semiconductor well with a second semiconductor well in the first semiconductor well, and the second epitaxial structure is electrically isolated from the first semiconductor well with a dielectric layer.

In another aspect of the present disclosure, a semiconductor device is disclosed. The semiconductor device includes a plurality of nanostructures disposed above a first semiconductor well and extending along a first lateral direction. The semiconductor device includes a gate structure extending along a second lateral direction and wrapping around each of the plurality of nanostructures. The semiconductor device includes a first epitaxial structure coupled to a first end of each of the plurality of nanostructures along the first lateral direction. The semiconductor device includes a second epitaxial structure coupled to a second end of each of the plurality of nanostructures along the first lateral direction. A first bottom surface of the first epitaxial structure is in direct contact with a second semiconductor well disposed in the first semiconductor well, and a second bottom surface of the second epitaxial structure is isolated from the first semiconductor well with a dielectric layer.

In yet another aspect of the present disclosure, a method for fabricating semiconductor devices is disclosed. The method includes forming a first semiconductor well in a substrate. The method includes forming a second semiconductor well in the first semiconductor well with a first depth. The method includes forming a third semiconductor well in the first semiconductor well with a second depth, wherein the first depth is greater than the first depth. The method includes overlaying the third semiconductor well with a dielectric layer. The method includes forming a first epitaxial structure and a second epitaxial structure above the second semiconductor well and the third semiconductor well, respectively, wherein the first and second epitaxial structures are coupled to opposite ends of a channel structure that includes a plurality of nanostructures vertically spaced from one another. The first epitaxial structure is electrically coupled to the first semiconductor well through the second semiconductor well, and the second epitaxial structure is electrically isolated from the first and third semiconductor well through the dielectric layer.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first semiconductor well;
   a channel structure disposed above the first semiconductor well and extending along a first lateral direction;
   a gate structure extending along a second lateral direction and straddling the channel structure;
   a first epitaxial structure disposed on a first side of the channel structure; and
   a second epitaxial structure disposed on a second side of the channel structure, the first side and second side opposite to each other in the first lateral direction;
   wherein the first epitaxial structure is electrically coupled to the first semiconductor well via a second semiconductor well in the first semiconductor well, and the second epitaxial structure is electrically isolated from the first semiconductor well with a dielectric layer.

2. The semiconductor device of claim 1, wherein the first and second epitaxial structure each have a first conductive type, the second semiconductor well has the first conductive type, and the first semiconductor well has a second conductive type opposite to the first conductive type.

3. The semiconductor device of claim 1, wherein the first epitaxial structure serves as a source terminal of a field effect transistor and the second epitaxial structure operatively serves as a drain terminal of the field effect transistor, with the gate structure serves as a gate terminal of the field effect transistor.

4. The semiconductor device of claim 1, wherein the first epitaxial structure serves as a positive terminal of a diode, and the second epitaxial structure, the gate structure, and the first semiconductor well, coupled to each other, that collectively serve as a negative terminal of the diode.

5. The semiconductor device of claim 1, further comprising a third semiconductor well in the first semiconductor well, wherein the third semiconductor well is electrically isolated from the second epitaxial structure with the dielectric layer.

6. The semiconductor device of claim 5, wherein the second semiconductor well extends into the first semiconductor well with a first depth and the third semiconductor well extends into the first semiconductor well with a second depth, and wherein the first depth is greater than the second depth.

7. The semiconductor device of claim 6, wherein the first depth is about twice the second depth.

8. The semiconductor device of claim 1, wherein the channel structure includes a plurality of nanostructures, each of the nanostructures extending along the first lateral direction.

9. The semiconductor device of claim 8, wherein the gate structure wraps around each of the nanostructures.

10. The semiconductor device of claim 1, wherein the first semiconductor well and the second semiconductor well collectively serve as a p-n junction coupled to the first epitaxial structure.

11. A semiconductor device, comprising:
 a plurality of nanostructures disposed above a first semiconductor well and extending along a first lateral direction;
 a gate structure extending along a second lateral direction and wrapping around each of the plurality of nanostructures;
 a first epitaxial structure coupled to a first end of each of the plurality of nanostructures along the first lateral direction; and
 a second epitaxial structure coupled to a second end of each of the plurality of nanostructures along the first lateral direction;
 wherein a first bottom surface of the first epitaxial structure is in direct contact with a second semiconductor well disposed in the first semiconductor well, and a second bottom surface of the second epitaxial structure is isolated from the first semiconductor well with a dielectric layer.

12. The semiconductor device of claim 11, wherein the first and second epitaxial structure each have a first conductive type, the second semiconductor well has the first conductive type, and the first semiconductor well has a second conductive type opposite to the first conductive type.

13. The semiconductor device of claim 11, wherein the first epitaxial structure serves as a source terminal of a field effect transistor and the second epitaxial structure operatively serves as a drain terminal of the field effect transistor, with the gate structure serves as a gate terminal of the field effect transistor.

14. The semiconductor device of claim 11, wherein the first epitaxial structure serves as a positive terminal of a diode, and the second epitaxial structure, the gate structure, and the first semiconductor well, coupled to each other, that collectively serve as a negative terminal of the diode.

15. The semiconductor device of claim 11, further comprising:
 a third epitaxial structure having an opposite conductive type to the first and second epitaxial structure; and
 a fourth epitaxial structure having a same conductive type as the first and second epitaxial structure.

16. The semiconductor device of claim 15, wherein the first epitaxial structure serves as an emitter terminal of a bipolar junction transistor, the third epitaxial structure serves as a base terminal of the bipolar junction transistor, and the fourth epitaxial structure serves as a collector terminal of the bipolar junction transistor.

17. The semiconductor device of claim 11, further comprising a third semiconductor well in the first semiconductor well, wherein the third semiconductor well is electrically isolated from the second epitaxial structure with the dielectric layer.

18. The semiconductor device of claim 17, wherein the second semiconductor well extends into the first semiconductor well with a first depth and the third semiconductor well extends into the first semiconductor well with a second depth, and wherein the first depth is greater than the second depth.

* * * * *